(12) United States Patent
Anderson et al.

(10) Patent No.: US 7,847,320 B2
(45) Date of Patent: Dec. 7, 2010

(54) DENSE CHEVRON NON-PLANAR FIELD EFFECT TRANSISTORS AND METHOD

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 11/939,574

(22) Filed: Nov. 14, 2007

(65) Prior Publication Data

US 2009/0121291 A1   May 14, 2009

(51) Int. Cl.
*H01L 29/80* (2006.01)

(52) U.S. Cl. .............................. 257/202; 257/E27.108

(58) Field of Classification Search ................ 257/202, 257/204, 206, 401, E27.108, E29.052, E29.12, 257/E29.13, E29.136, E29.137
See application file for complete search history.

(56) References Cited

U.S. PATENT DOCUMENTS

| | | | |
|---|---|---|---|
| 6,716,690 B1 | 4/2004 | Wang et al. | |
| 6,794,718 B2 | 9/2004 | Nowak et al. | |
| 6,867,460 B1 | 3/2005 | Anderson et al. | |
| 7,102,181 B1 | 9/2006 | Nowak et al. | |
| 2005/0173759 A1 | 8/2005 | Kim et al. | |
| 2006/0154426 A1* | 7/2006 | Anderson et al. | ............ 438/300 |
| 2006/0214233 A1 | 9/2006 | Ananthanarayanan et al. | |
| 2007/0063276 A1* | 3/2007 | Beintner et al. | ............. 257/347 |
| 2007/0082437 A1 | 4/2007 | Cheng et al. | |

* cited by examiner

*Primary Examiner*—Minh-Loan T Tran
*Assistant Examiner*—Vongsavanh Sengdara
(74) *Attorney, Agent, or Firm*—Gibb I.P. Law Firm, LLC; Richard M. Kotulak, Esq.

(57) ABSTRACT

Disclosed are embodiments of semiconductor structure and a method of forming the semiconductor structure that simultaneously maximizes device density and avoids contacted-gate pitch and fin pitch mismatch, when multiple parallel angled fins are formed within a limited area on a substrate and then traversed by multiple parallel gates (e.g., in the case of stacked, chevron-configured, CMOS devices). This is accomplished by using, not a minimum lithographic fin pitch, but rather by using a fin pitch that is calculated as a function of a pre-selected contacted-gate pitch, a pre-selected fin angle and a pre-selected periodic pattern for positioning the fins relative to the gates within the limited area. Thus, the disclosed structure and method allow for the conversion of a semiconductor product design layout with multiple, stacked, planar FETs in a given area into a semiconductor product design layout with multiple, stacked, chevron-configured, non-planar FETs in the same area.

19 Claims, 11 Drawing Sheets

DENSE CHEVRON NON-PLANAR FIELD EFFECT TRANSISTORS AND METHOD

BACKGROUND

1. Field of the Invention

The embodiments of the invention generally relate to integrated circuit structures and, more particularly, to an integrated circuits structure that incorporates multiple stacked chevron non-planar field effect transistors (FETs) and a method of forming the integrated circuit structure.

2. Description of the Related Art

As transistor design is improved and evolves, the number of different types of transistors continues to increase. Multigated non-planar metal oxide semiconductor field effect transistors (FETs), including dual-gate non-planar FETs (e.g., finFETs) and tri-gate non-planar FETs, were developed to provide scaled devices with higher drive currents and reduced short channel effects over planar FETs.

Additionally, the mobility of charge carriers in FET channel regions can be optimized for different types of FETS (i.e., n-type FETs (NFETs) or p-type FETs (PFETs)) as a function of the semiconductor crystalline orientation. Specifically, in a PFET, hole mobility can be optimized and transistor switching delay can be minimized by forming the channel region with a semiconductor having a [110] crystalline orientation. Contrarily, in an NFET, electron mobility can be optimized and delay can be minimized by forming the channel region with a semiconductor having a [100] crystalline orientation. To that end, U.S. Pat. No. 6,794,718, issued to Nowak et al. on Sep. 21, 2004 and incorporated herein by reference, discloses a complementary metal oxide semiconductor (CMOS) structure that comprises a fin-type NFET having an n-channel in a semiconductor fin with a [100] orientation and a fin-type PFET having a p-channel in a semiconductor fin with a [110] orientation. The [100] and [110] orientation semiconductor fins are formed on the same substrate, but are positioned with a non-orthogonal, non-parallel orientation with respect to one another (i.e., a chevron structure) in order to achieve the different crystalline orientations. Gates are then formed (i.e., lithographically patterned) across the fins such that the semiconductor fin(s) of completed FETs are positioned at a non-perpendicular angle with respect to the gates. See also U.S. Pat. No. 6,867,460 issued to Anderson et al. on Mar. 15, 2005 and incorporated herein by reference, which discloses a static random access memory (SRAM) cell with chevron finFET logic.

As mentioned above, non-planar FETs (e.g., finFETs or trigate FETs) were developed to provide scaled devices over planar FETs. The scaled devices generally allowed semiconductor products to be produced with an even greater CMOS device density (i.e., a greater number of stacked transistors in a given area) over those prior art semiconductor products that included CMOS devices with only planar FETs. Also as mentioned above, chevron CMOS devices (i.e., CMOS devices with non-planar FETs having angled semiconductor fins) were developed to optimize device performance. However, if multiple stacked non-planar FETs are formed with a chevron configuration with a current minimum lithographic contacted-gate pitch and a current minimum lithographic fin pitch, mismatch of the contacted-gate pitch and the fin pitch inevitably results.

SUMMARY

In view of the foregoing, disclosed herein are embodiments of a semiconductor structure and a method of forming the semiconductor structure that simultaneously maximizes device density and avoids contacted-gate pitch and fin pitch mismatch, when multiple parallel angled fins are formed within a limited area on a substrate and then traversed by multiple parallel gates (e.g., in the case of stacked, chevron-configured, complementary metal oxide semiconductor (chevron CMOS) devices). This is accomplished by using, not a minimum lithographic fin pitch, but rather by using a fin pitch that is calculated as a function of a pre-selected contacted-gate pitch, a pre-selected fin angle and a pre-selected periodic pattern for positioning the fins relative to the gates within the limited area. Thus, the disclosed structure and method allow for the conversion of a semiconductor product design layout with multiple planar FETs in a given area into a semiconductor product design layout with multiple, chevron-configured, non-planar FETs (i.e., stacked finFETs or trigate FETs having angled semiconductor fins) in the same area.

More particularly, disclosed herein are embodiments of a method of forming an integrated circuit structure. The method embodiments comprise first providing a substrate and designating a limited area of the substrate for subsequent formation of multiple parallel angled semiconductor fins and multiple parallel gates traversing (intersecting) those fins. Each limited area can, for example, be rectangular in shape and can correspond to an area designated in a prior art semiconductor product design layout for the formation of multiple planar n-type field effect transistors (NFETS) or multiple planar p-type field effect transistors (PFETS) for an integrated circuit structure having multiple stacked CMOS devices.

Once a limited area is designated, various circuit structure parameters can be pre-selected. Specifically, a first pitch between the gates (i.e., a contacted-gate pitch) can be pre-selected. For example, the currently achievable minimum lithographic contacted-gate pitch can be determined and selected as the contacted-gate pitch. The angle of intersection between the fins and the gates can also be pre-selected so that the fins will be positioned relative to the gates at an angle other than 90 degrees (e.g., at an angle of approximately 67.5 degrees). More specifically, the angle of the fins can be pre-selected based on a desired crystalline orientation. Finally, a periodic pattern for positioning the fins relative to the gates within the limited area can be pre-selected such that the periodic pattern repeats at a desired interval within the limited area and, more specifically, such that the periodic pattern is sufficient to convert a first design layout that comprises planar field effect transistors within the limited area to a second design layout that comprises non-planar field effect transistors (e.g., finFETs or trigate FETs) within the same limited area. The process of pre-selecting the periodic pattern can be comprise choosing a first number N such that the periodic pattern repeats within the limited area at every Nth gate and also choosing a second number M such that the periodic pattern further repeats within the limited area at every Mth fin.

Then, based on the pre-selected angle, on the ratio of the first number N over the second number M in the periodic pattern and on the contacted-gate pitch, the value of a second pitch (i.e., the fin pitch) that is necessary to achieve the pre-selected periodic pattern without resulting in mismatch between the contacted-gate pitch and the fin pitch can be calculated. This can be accomplished by solving for: $P_{fins} = N/M(P_{gates} \times \cos B)$, where $P_{fins}$ is the fin pitch, $P_{gates}$ is the contacted-gate pitch and B comprises the angle of the fins relative to the gates. It should be noted that the previously discussed process of pre-selecting the periodic pattern and, more particularly, the processes of choosing the first number N and choosing the second number M should be accomplished such when the fin pitch is subsequently calculated the resulting pitch value will be as great as or greater than the currently achievable minimum lithographic fin pitch.

Once the fin pitch is calculated, fins with the calculated fin pitch and gates with the pre-selected contacted-gate pitch can be formed on the substrate within the limited area using conventional processing such that the fins are positioned with the pre-selected periodic pattern and at the pre-selected angle relative to the gates. Forming the fins with the calculated fin pitch rather than with a currently achievable minimum lithographic fin pitch avoids mismatch between the contacted-gate pitch and fin pitch (i.e., ensures fin alignment) and simultaneously maximizes device density within the limited area.

Also disclosed are embodiments of an integrated circuit structure (e.g., an integrated circuit structure with multiple, stacked, chevron-configured CMOS devices) formed according to the method embodiments, discussed above. This integrated circuit structure comprises a designated limited area of the substrate. Each limited area can, for example, be rectangular in shape and can correspond to an area designated in a prior art semiconductor product design layout for the formation of either multiple planar n-type field effect transistors (NFETS) or multiple planar p-type field effect transistors (PFETS) for an integrated circuit structure having multiple, stacked, CMOS devices.

Within the designated limited area, the integrated circuit structure can comprise multiple, parallel, gates that traverse multiple, parallel, angled fins. These gates can have a pre-selected first pitch (e.g., a currently achievable minimum lithographic contacted-gate pitch). The fins can have a pre-selected angle relative to the gates (e.g., an angle other than 90 degrees, such as approximately 67.5 degrees). This angle can be pre-selected to ensure that the fins have a desired crystalline orientation. Additionally, the fins can be positioned relative to the gates according to a pre-selected periodic pattern that repeats at every Nth gate and at every Mth fin. Finally, the fins can have a predetermined second pitch (i.e., predetermined fin pitch). Specifically, the value of this fin pitch can be calculated based on the pre-selected angle of the fins relative to the gates, on the ratio of N over M in the pre-selected periodic pattern and on the contacted-gate pitch, in order to achieve the periodic pattern without mismatch between the contacted-gate pitch and the fin pitch. More specifically, the value of the fin pitch can be equal to the ratio of N/M multiplied by the contacted-gate pitch and further multiplied by the cosine of the angle of the fins relative to the gates. It should be noted that N and M are pre-selected such the fin pitch is as great as or greater than the currently achievable minimum lithographic fin pitch. Due to this calculated fin pitch, as opposed to a currently achievable minimum lithographic fin pitch, device density is maximized in the limited area without mismatch between the contacted-gate pitch and fin pitch (i.e., the fins on adjacent gates are aligned/connected).

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. That is, it should be understood that any changes and modifications may be made within the scope of the embodiments without departing from the spirit thereof, and the embodiments shall include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
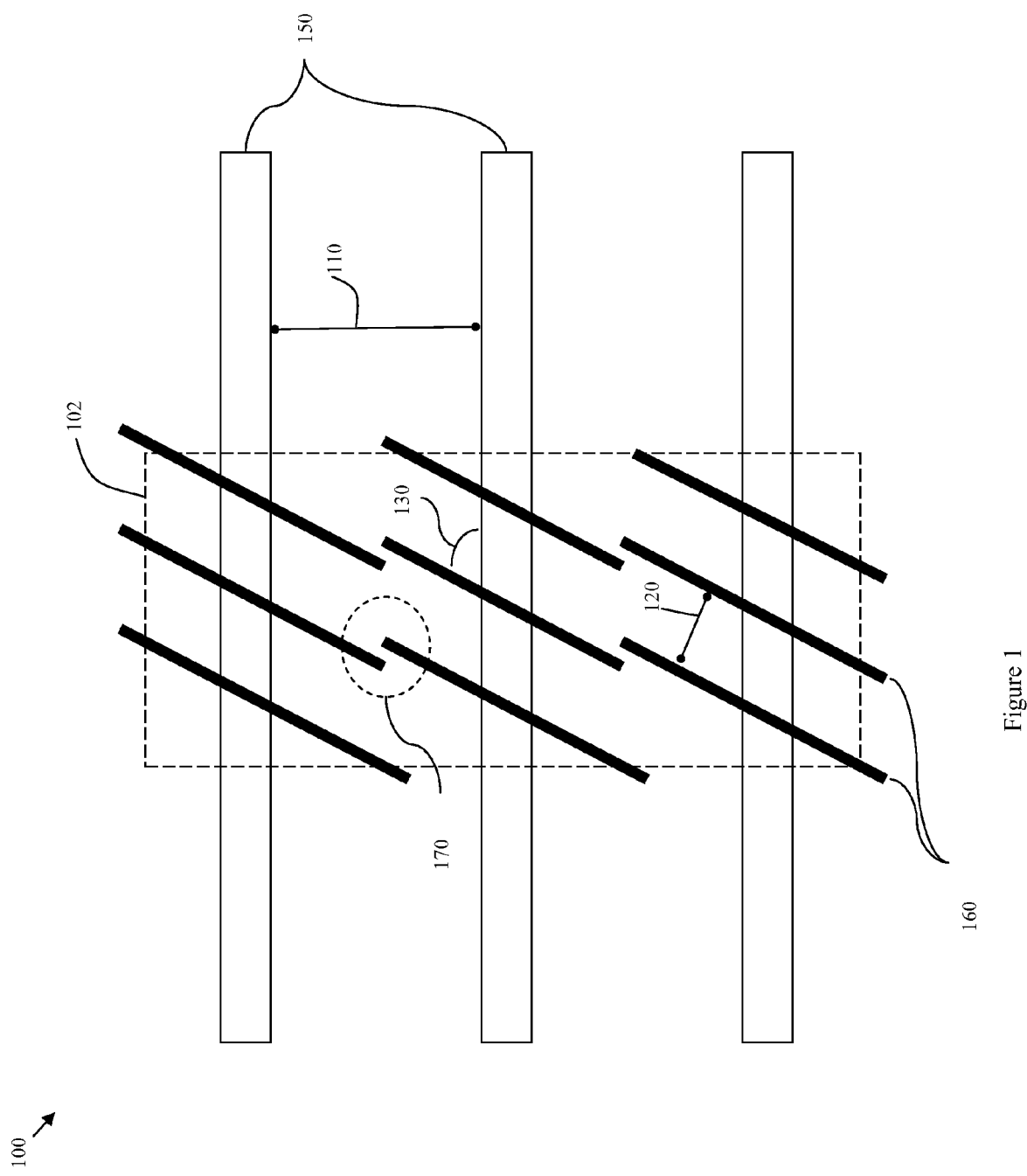
FIG. 1 is a top view block diagram illustrating stacked, chevron-configured, non-planar field effect transistors with misaligned semiconductor fins.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, non-planar field effect transistors (e.g., finFETs or trigate FETs formed with semiconductor fins) were developed to provide scaled devices over planar FETs. The scaled devices generally allowed semiconductor products to be produced with an even greater device density (i.e., a greater number of stacked transistors in a given area) over those prior art semiconductor products that included only planar FETs. Also as mentioned above, chevron-configured, complementary metal oxide semiconductor (CMOS) devices were developed to optimize device performance.

Thus, circuit designers will often try to convert a planar FET design layout into to a chevron-configured, non-planar FET design layout in a designated limited area 102 of a substrate 101 in order to increase device density and optimize device performance. However, as illustrated in FIG. 1, if multiple chevron-configured, stacked, non-planar FETs are formed on a substrate 101 such that their gates 150 have a current minimum lithographic contacted-gate pitch 110 and further such that their semiconductor fins 160 have a current minimum lithographic fin pitch 120, mismatch 170 of the contacted-gate pitch 110 and the fin pitch 120 inevitably results. Consequently, fins 160 corresponding to adjacent gates 150 will be misaligned and not connected.

Figure 2:
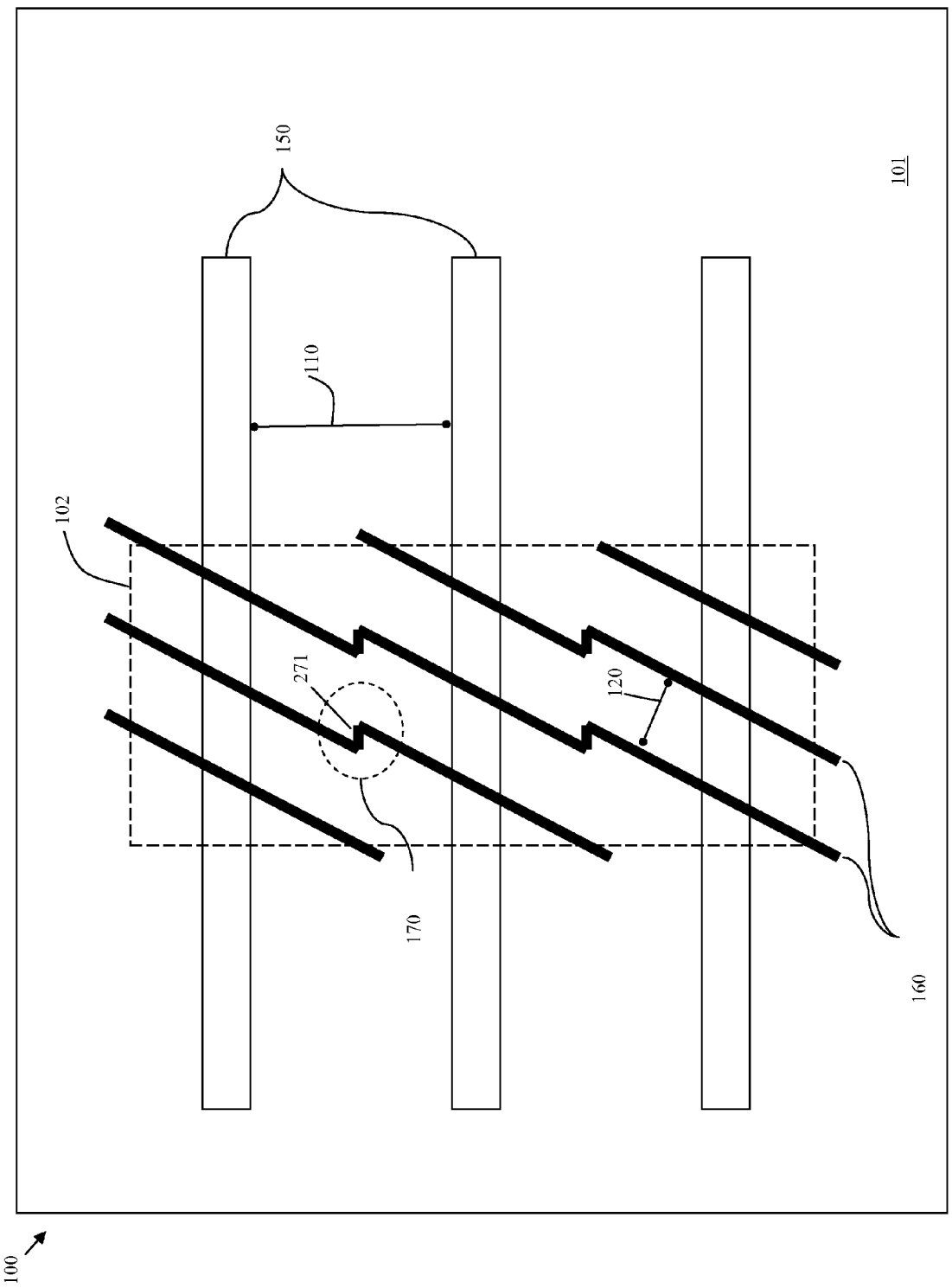
FIG. 2 is a top view block diagram illustrating connectors for linking the misaligned semiconductor fins of FIG. 1.
Figure 3:
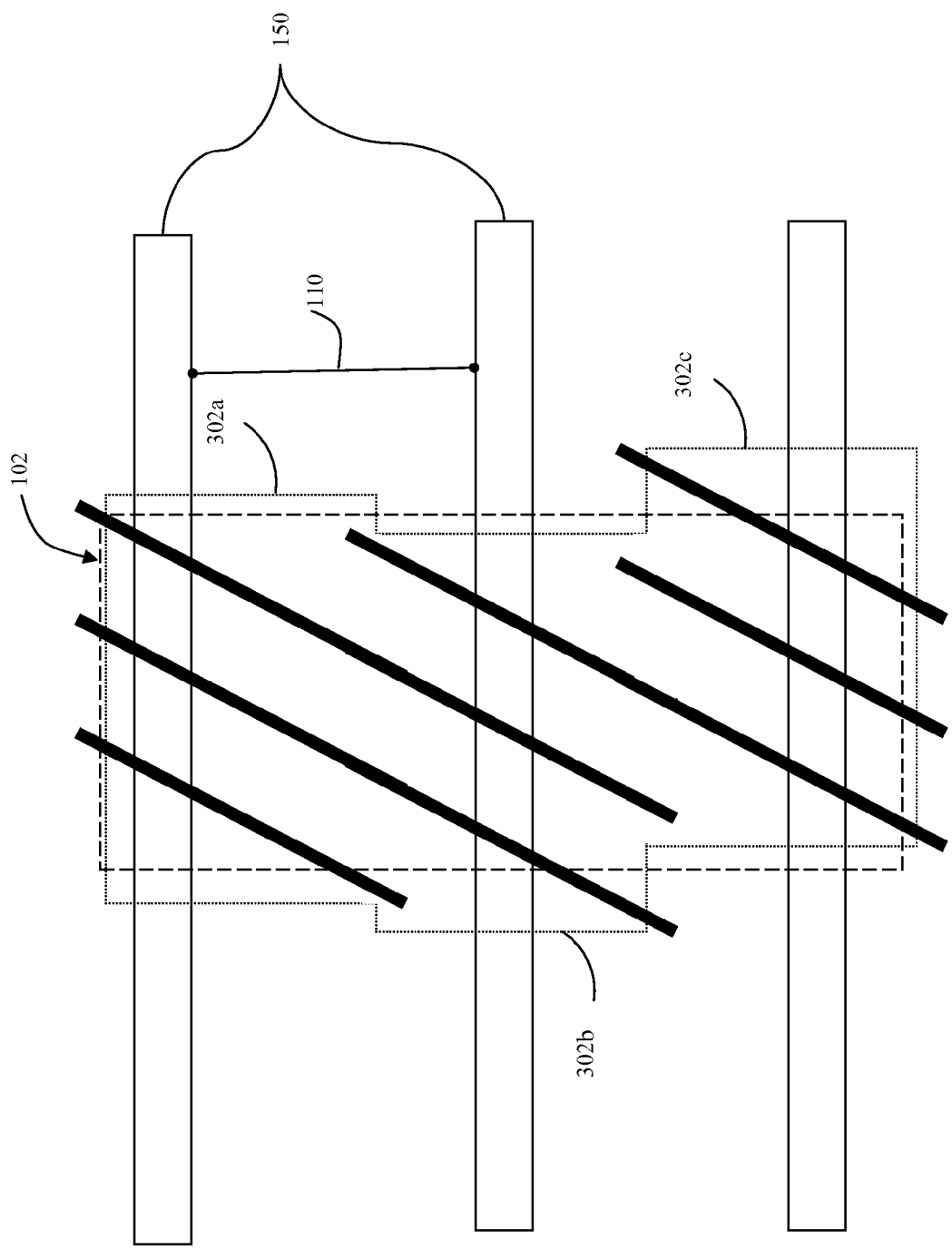
FIG. 3 is top view block diagram illustrating stacked, chevron-configured, non-planar field effect transistors that are staggered to avoid the misalignment problem illustrated in FIG. 1.

As illustrated in FIG. 2, one suggested solution to this mismatch/misalignment problem is to pattern connectors 271 between the fins 160. However, current lithographic techniques can not adequately reproduce such small connectors 271 and failing to reproduce these connectors 271 will degrade FET performance. As illustrated in FIG. 3, another suggested solution is to stagger the devices outside the original design layout 102 (see staggered design layout sections 302a-c). Unfortunately, staggering the devices results in a large device-density penalty.

In view of the foregoing, disclosed herein are embodiments of semiconductor structure and a method of forming the semiconductor structure that simultaneously maximizes device density and avoids contacted-gate pitch and fin pitch mismatch, when multiple parallel angled fins are formed within a limited area on a substrate and then traversed by multiple parallel gates (e.g., in the case of stacked, chevron-configured, complementary metal oxide semiconductor (chevron CMOS) devices). This is accomplished by using, not a minimum lithographic fin pitch, but rather by using a fin pitch that is calculated (i.e., tailored) as a function of a pre-selected contacted-gate pitch, a pre-selected fin angle and a pre-selected periodic pattern for positioning the fins relative to the gates within the limited area. Thus, the disclosed structure and method embodiments allow for the conversion of a semiconductor product design layout with multiple, stacked, planar FETs in a given area into a semiconductor product design layout with multiple, stacked, chevron-configured, non-planar FETs (i.e., stacked finFETs or trigate FETs having angled semiconductor fins) in the same area.

Figure 4:
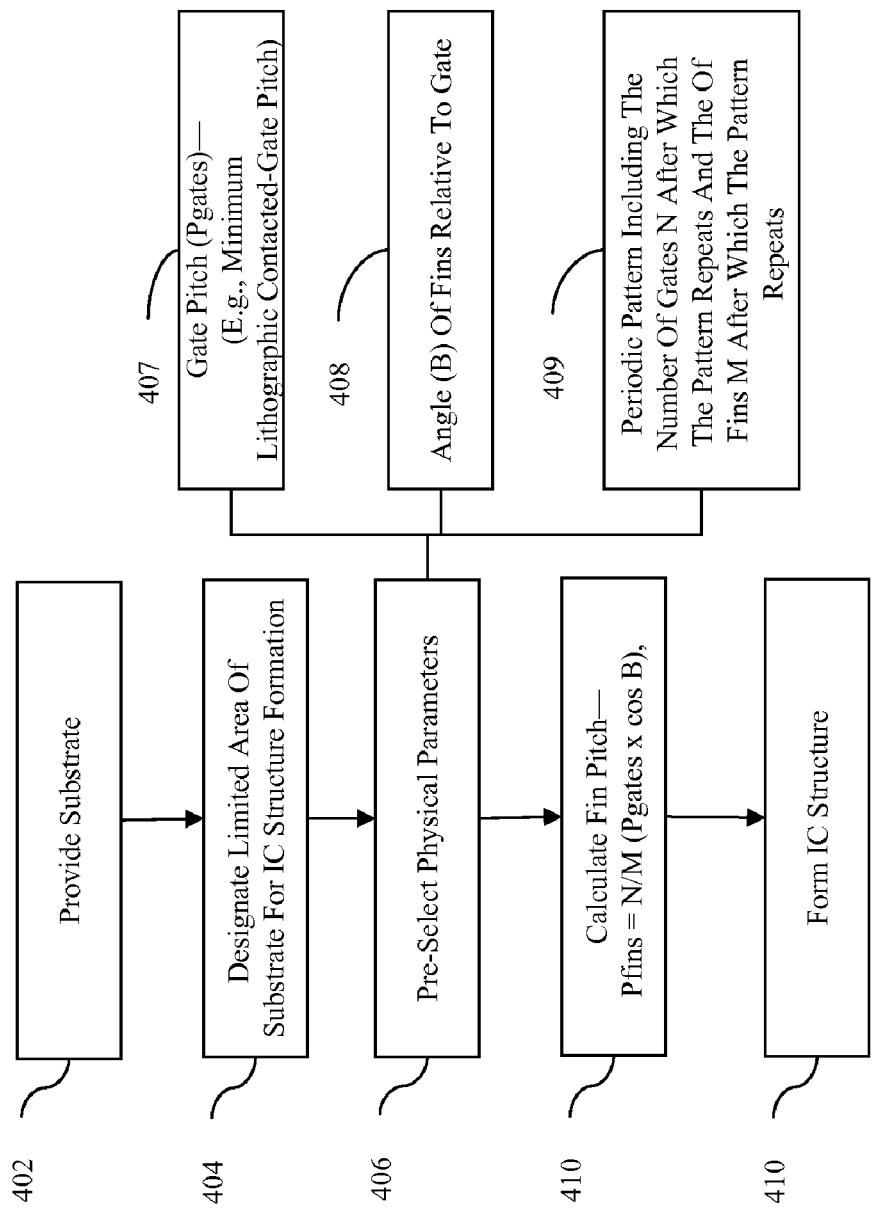
FIG. 4 is a flow diagram illustrating embodiments of a method of forming an integrated structure including stacked, chevron-configured, non-planar field effects without the misaligned semiconductor fins of FIG. 1.
Figure 5:
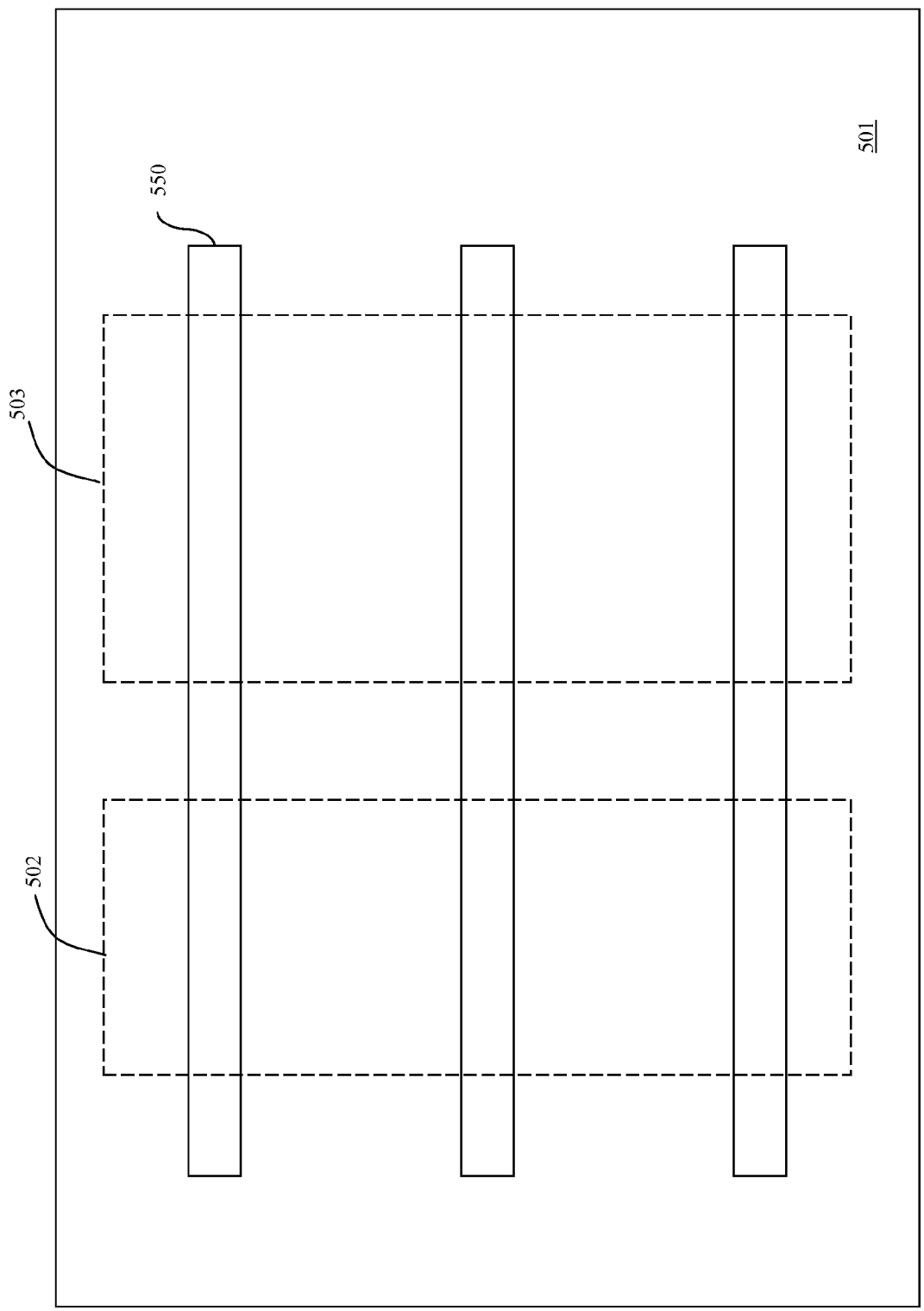
FIG. 5 is a top view block diagram illustrating a partially completed integrated circuits structure form according to the method of FIG. 4.
Figure 6:
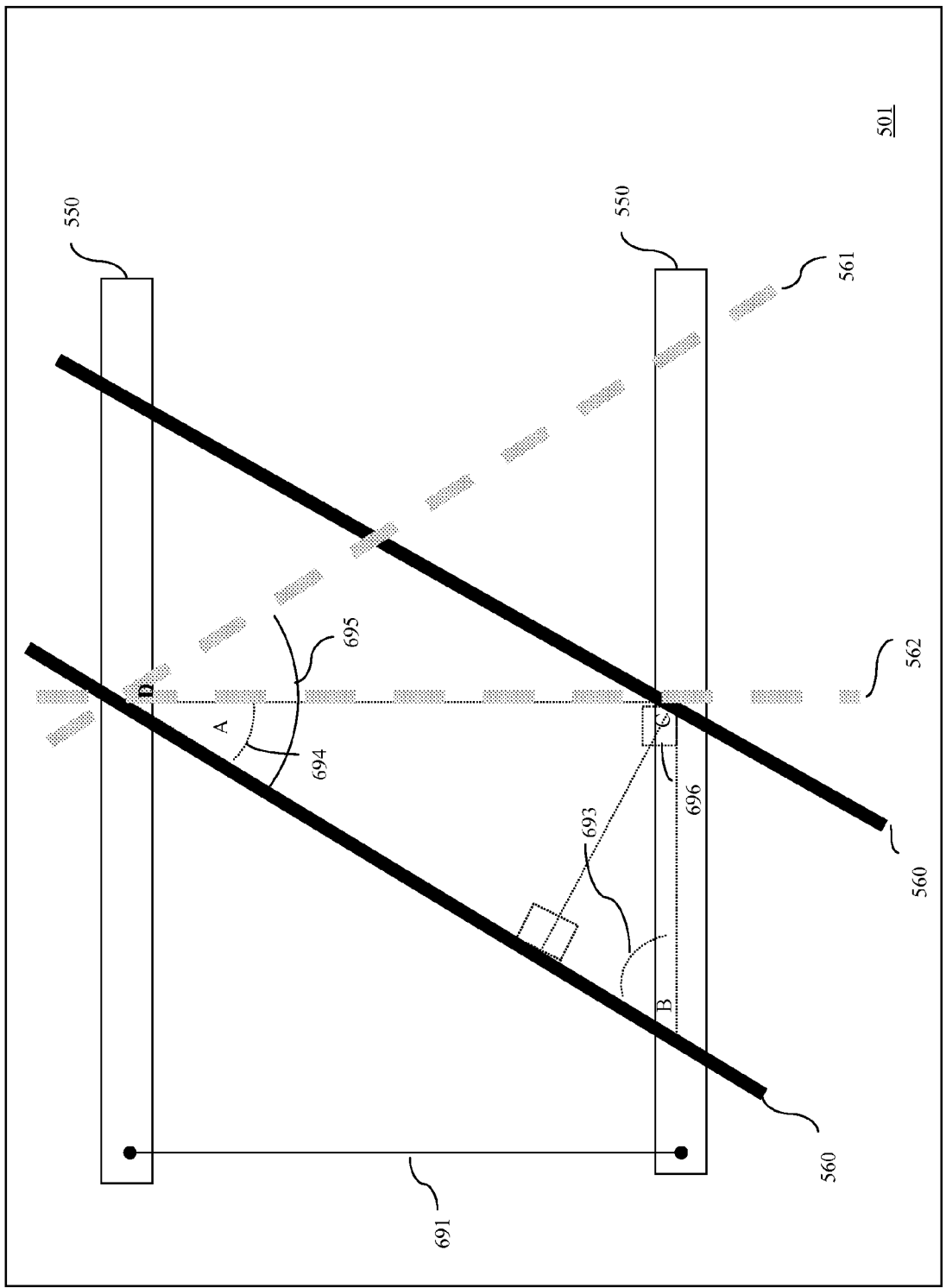
FIG. 6 is a top view block diagram illustrating a technique for pre-selecting the angle of the semiconductor fins relative to the gates at process 408 of FIG. 4.

More particularly, referring to FIG. 4, disclosed herein are embodiments of a method of forming an integrated circuit structure (e.g., an integrated circuit with multiple, stacked, chevron CMOS devices), having adjacent, essentially symmetric, sections of multiple parallel angled semiconductor fins and multiple parallel gates traversing (intersecting) those fins. The method embodiments comprise first providing a substrate 501 (e.g., a silicon-on-insulator (SOI) wafer, a bulk silicon wafer, etc.) and designating limited areas 502, 503 of the substrate 501 for subsequent formation of each section of the integrated circuit structure (402-404, see FIG. 5). That is, limited areas 502, 503 are designated for each section of the structure. Each limited area 502, 503 can, for example, be rectangular in shape and can correspond to an area designated in a prior art semiconductor product design layout for the formation of either multiple planar n-type field effect transistors (NFETS) or multiple planar p-type field effect transistors (PFETS) for an integrated circuit structure having multiple stacked CMOS devices. Once a limited area (e.g., see limited area 502) is designated, various circuit structure parameters can be pre-selected for the subsequent formation, within that limited area 502, of multiple, parallel, angled semiconductor fins and multiple, parallel gates traversing (intersecting) those fins (406, see FIG. 6).

Specifically, a first pitch 691 between the gates 550 (i.e., a contacted-gate pitch) can be pre-selected (407). For example, the currently achievable minimum lithographic contacted-gate pitch can be determined and selected as the contacted-gate pitch 691. This contacted-gate pitch is typically determined by a number of factors, such as the minimum gate length, the contact size, and the minimum space required between a contact to a source or a drain and a gate. This minimum space must be great enough so that the contact to the source or drain does not also contact the gate, within expected manufacturing tolerances.

The angle B 693 of the fins 560 relative to the gates 550 (angle of intersection) can also be pre-selected so that the fins 560 will be positioned relative to the gates 550 at an angle other than 90 degrees (e.g., at an angle of approximately 67.5 degrees). This angle 693 can, for example, be pre-selected based on a desired crystalline orientation. U.S. Pat. No. 6,867,460 cited above and incorporated herein by reference, explains that [100] and [110] planes are orientated at an angle of 45 degrees with respect to each other, when formed by vertical surfaces cut from a [100] orientation-surfaced wafer. Thus, chevron CMOS devices formed from a [100] orientation-surfaced silicon wafer 501 will have semiconductor fins 560 in an area designated for PFETs at a 45 degree angle D (see item 695) relative to semiconductor fins 561 formed in an area designated for NFETs and, more specifically, at a 22.5 degree angle A (see item 694) relative to a center line 562 through the wafer 501. Gates 550 are generally formed at a right angle C (see item 696) to the center line 562. Thus, the pre-selected angle B (see item 693) of the fins 560 relative to the gates 550 can be approximately 67.5 (i.e., 90-22.5 degrees).

Finally, a periodic pattern for positioning the fins 560 relative to the gates 550 within the limited area 502 can be pre-selected such that the periodic pattern repeats at a desired interval within the limited area 502 and, more specifically, such that the periodic pattern is sufficient to convert a first design layout that comprises multiple, stacked, planar field effect transistors within the limited area to a second design layout that comprises multiple, stacked, chevron-configured, non-planar field effect transistors (e.g., finFETs or trigate FETs) within the same limited area 502 (409). The process of pre-selecting the periodic pattern can be comprise choosing a first number N such that the periodic pattern repeats within the limited area 502 at every Nth gate 550 and also choosing a second number M such that the periodic pattern further repeats within the limited area at every Mth fin 560.

Figure 7:
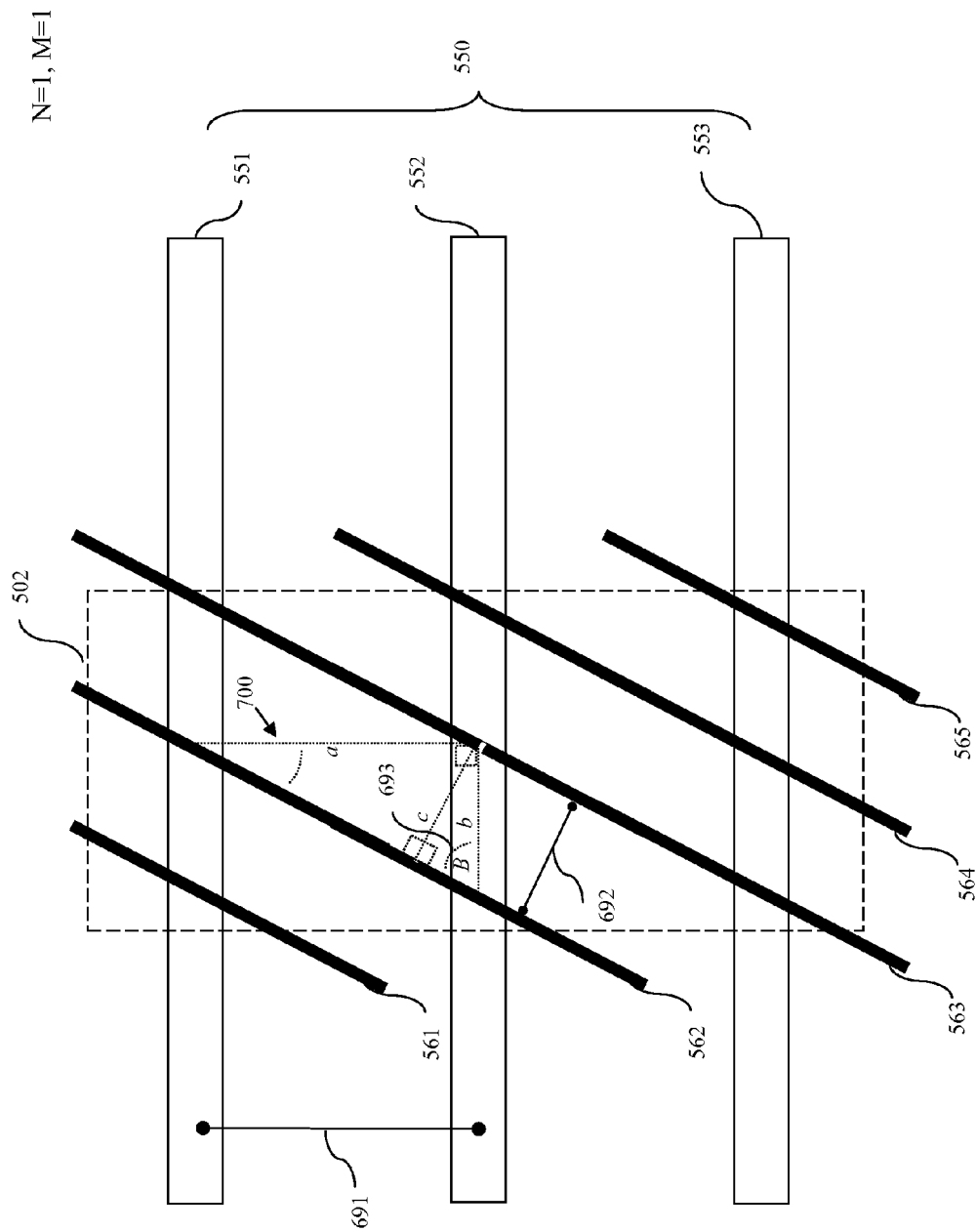
FIG. 7 is a top view block diagram illustrating an integrated circuit structure formed according to the method of FIG. 4.
Figure 8:
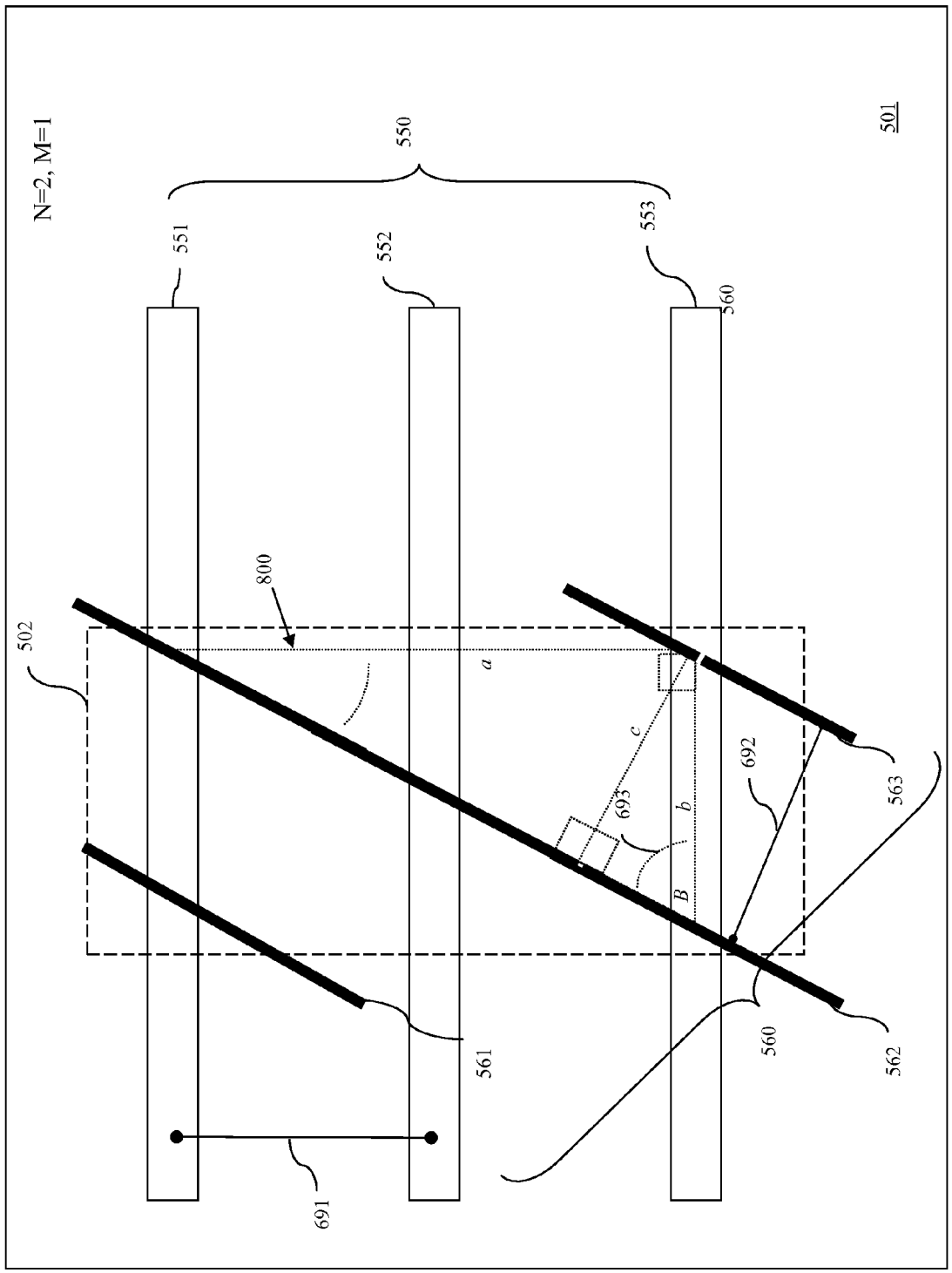
FIG. 8 is a top view block diagram illustrating an integrated circuit structure formed according to the method of FIG. 4.
Figure 9:
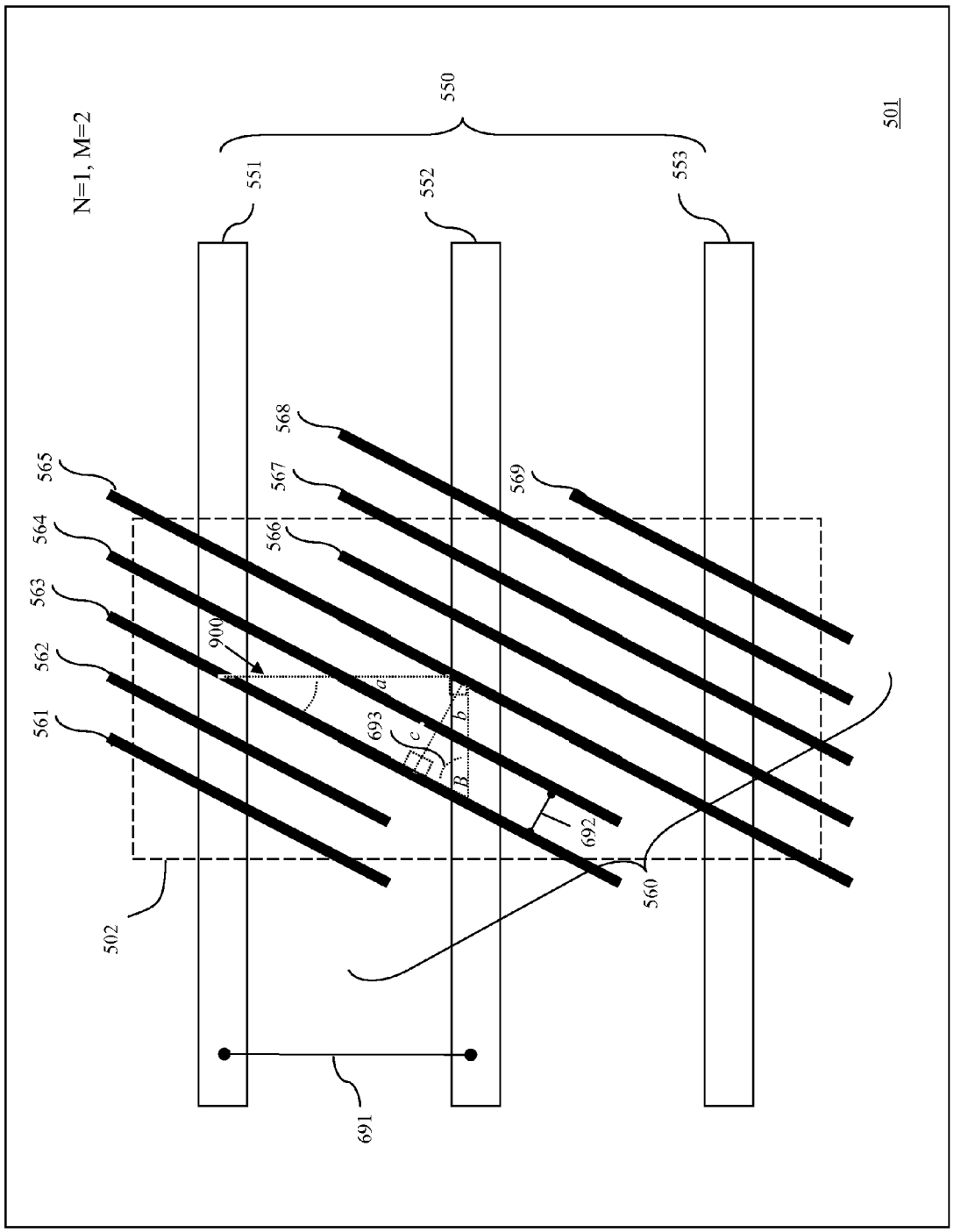
FIG. 9 is a top view block diagram illustrating an integrated circuit structure formed according to the method of FIG. 4.
Figure 10:
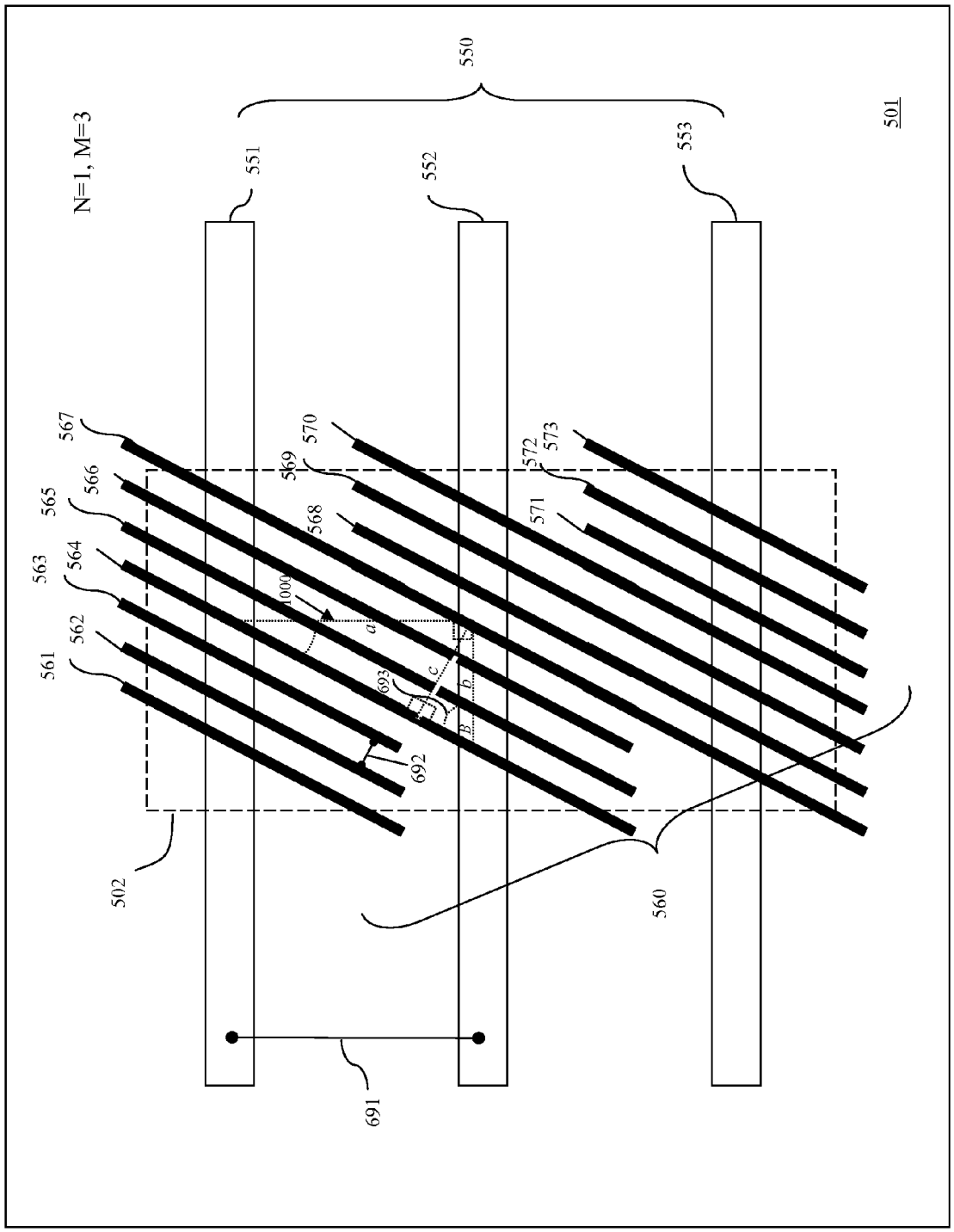
FIG. 10 is a top view block diagram illustrating an integrated circuit structure formed according to the method of FIG. 4.
Figure 11:
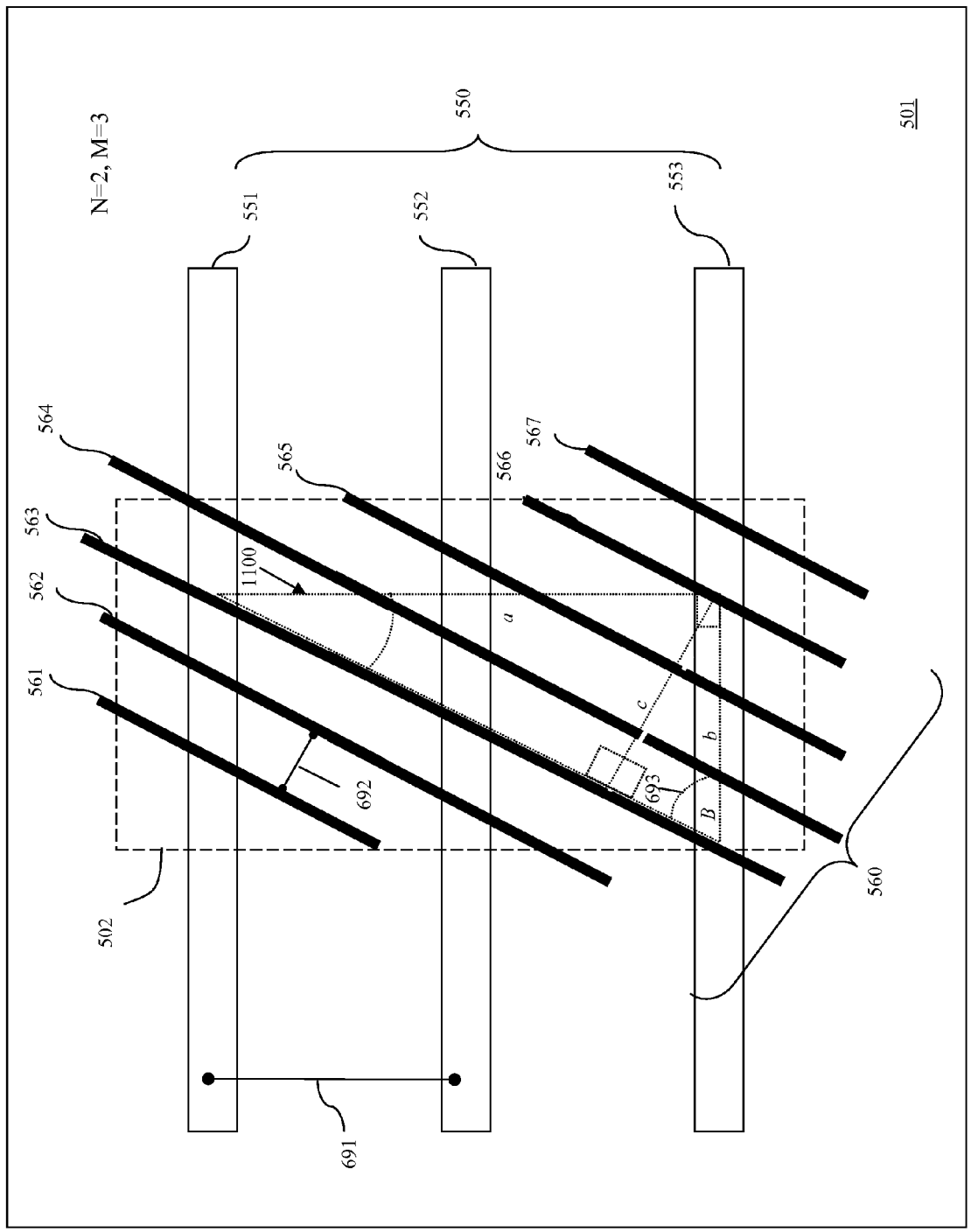
FIG. 11 is a top view block diagram illustrating an integrated circuit structure formed according to the method of FIG. 4.

For example, as illustrated in FIG. 7, choosing a first number N equal to one and a second number M equal to one would result in the selection of a periodic pattern than repeats with every gate 551-552 and with every fin 561-566 in the limited area 502. As illustrated in FIG. 8, choosing a first number N equal to two and a second number M equal to one would result in the selection of a periodic pattern that repeats with every second gate (see gates 551 and 553) and with every fin 561-563 in the limited area 502. As illustrated in FIG. 9, choosing a first number N equal to one and a second number M equal to two would result in the selection of a periodic pattern that repeats with every gate 551-553 and with every second fin (see fins 561, 563, 565, 567 . . . ) in the limited area 502. As illustrated in FIG. 10, choosing a first number N equal to one and a second number M equal to three would result in the selection of a periodic pattern that repeats with every first gate 551-553 and with every third fin (see fins 561, 564, 567 . . . ) in the limited area 502. As illustrated in FIG. 11, choosing a first number N equal to two and a second number M equal to three would result in the selection of a periodic pattern that repeats with every second gate (see gates 551 and 553) and with every third fin (see fin 563 . . . ) in the limited area 502 and so on.

Then, based on the pre-selected angle B (see item 693), on the ratio of the first number N over the second number M in the periodic pattern and on the contacted-gate pitch 691, the value of a second pitch 692 (i.e., the fin pitch) that is necessary to achieve the pre-selected periodic pattern without resulting in mismatch between the contacted-gate pitch and the fin pitch can be calculated (410, FIGS. 7-11). This can be accomplished by solving for: $P_{fins}=N/M(P_{gates}\times \cos B)$, where $P_{fins}$ is the fin pitch, $P_{gates}$ is the contacted-gate pitch and B comprises the angle of the fins relative to the gates.

More specifically, if both the first number N and the second number M are equal to one (as illustrated in FIG. 7), then the length of the side a of triangle 700 will extend from one gate 551 to an adjacent gate 552 (i.e., will be equal to the contacted-gate pitch 691) and the length of the side b of triangle 700 will extend from one fin 562 to an adjacent fin 563. Thus, bisecting line d will be equal to the fin pitch 692 and the process of calculating the fin pitch 692 can be accomplished simply by solving for triangle 700: $P_{fins}=P_{gates}\times \cos B$.

If the first number N is equal to two and the second number M is equal to one (as illustrated in FIG. 8), then the length of the side a of triangle 800 will extend from one gate 551 through an adjacent gate 552 to the next gate 553 (i.e., will be equal to two times the contacted-gate pitch 691) and the length of the side b of triangle 800 will extend from one fin 562 to an adjacent fin 563. Thus, bisecting line d will be equal to the fin pitch 692 and the process of calculating the fin pitch 692 can be accomplished simply by solving for triangle 800: $P_{fins}=2\times P_{gates}\times \cos B$.

If the first number N is equal to one and the second number M is equal to two (as illustrated in FIG. 9), then the length of the side a of triangle 900 will extend from one gate 551 to an adjacent gate 552 (i.e., will be equal to the contacted-gate pitch 691) and the length of the side b of triangle 900 will extend from one fin 563 through an adjacent fin 564 to the next fin 565. Thus, bisecting line d will be equal to twice the fin pitch 692 and the process of calculating the fin pitch 692 can be accomplished simply by solving for triangle 900: $P_{fins}=\frac{1}{2}\times P_{gates}\times \cos B$.

If the first number N is equal to one and the second number M is equal to three (as illustrated in FIG. 10), then the length of the side a of triangle 1000 will extend from one gate 551 to an adjacent gate 552 (i.e., will be equal to the contacted-gate pitch 691) and the length of the side b of triangle 1000 will extend from one fin 564 through fins 565 and 566 to the next fin 567. Thus, bisecting line d will be equal to three times the fin pitch 692 and the process of calculating the fin pitch 692 can be accomplished simply by solving for triangle 1000: $P_{fins}=\frac{1}{3}\times P_{gates}\times \cos B$.

If the first number N is equal to two and the second number M is equal to three (as illustrated in FIG. 11), then the length of the side a of triangle 1100 will extend from one gate 553 through an adjacent gate 552 to the next gate 553 (i.e., will be equal to twice the contacted-gate pitch 691) and the length of the side b of triangle 1100 will extend from one fin 563 through fins 565 and 565 to the next fin 566. Thus, bisecting line d will be equal to three times the fin pitch 692 and the process of calculating the fin pitch 692 can be accomplished simply by solving for triangle 1100: $P_{fins}=\frac{2}{3}\times P_{gates}\times \cos B$ and so on.

It should be noted that the previously discussed process of pre-selecting the periodic pattern and, more particularly, the processes of choosing the first number N and choosing the second number M should be accomplished such when the fin pitch is subsequently calculated the resulting pitch value will be as great as or greater than the currently achievable minimum lithographic fin pitch.

Once the fin pitch 692 is calculated, fins 560 with the calculated fin pitch 692 and gates 550 with the pre-selected contacted-gate pitch 691 can be formed on the substrate 501 within the limited area 502 using conventional processing such that the fins 560 are positioned with the pre-selected periodic pattern and at the pre-selected angle B 693 relative to the gates 550 (as illustrated in FIGS. 7-11). Forming the fins 550 with the calculated fin pitch $P_{fins}$ 692 rather than with a currently achievable minimum lithographic fin pitch avoids mismatch between the contacted-gate pitch 691 and fin pitch 692 (i.e. allows for alignment and connection of angled, fins on stacked gates) and simultaneously maximizes device density within the limited area 502.

Also disclosed are embodiments of an integrated circuit structure (e.g., as illustrated in FIGS. 6-11) formed according to the method embodiments, discussed above. The integrated circuit structure (e.g., an integrated circuit with multiple, stacked, chevron CMOS devices) comprises adjacent, essentially symmetric, sections of multiple, parallel, angled semiconductor fins 560 and multiple, parallel gates 550 traversing those fins 560.

Each section of the structure is located on a different designated limited area (e.g., see area 502) of the substrate 501. Each limited area 502 can, for example, be rectangular in shape and can correspond to an area designated in a prior art semiconductor product design layout for the formation of either multiple planar n-type field effect transistors (NFETS) or multiple planar p-type field effect transistors (PFETS) for an integrated circuit structure having multiple, stacked CMOS devices.

Within each designated limited area 502, the gates 550 traverse the fins 560. The gates 550 can have a pre-selected first pitch 691 (i.e., contacted-gate pitch). For example, the pre-selected first pitch 691 can comprise the currently achievable minimum lithographic contacted-gate pitch. The fins 560 can have a pre-selected angle B 693 relative to the gates 550. For example, the fins 560 can be positioned relative to the gates 550 at a pre-selected angle other than 90 degrees (e.g., approximately 67.5 degrees). As discussed in detail above, this angle B 693 can be pre-selected such that the fins 560 have a desired crystalline orientation. Additionally, the fins 550 can be positioned relative to the gates 560 according to a pre-selected periodic pattern that repeats at every Nth gate 550 and at every Mth fin 560.

For example, as illustrated in FIG. 7 and discussed above, if N equals one and M equals one, then the periodic pattern repeats with every gate 550 and with every fin 560 in the limited area 502. As illustrated in FIG. 8 and discussed above, if N equals two and M equals one, then the periodic pattern repeats with every second gate 550 and with every fin 560 in the limited area 502. As illustrated in FIG. 9 and discussed above, if N equals one and M equals two, then the periodic pattern repeats with every gate 550 and with every second fin 560 in the limited area 502. As illustrated in FIG. 10 and discussed above, if N equals one and M equals three, then the periodic pattern repeats with every gate 550 and with every third fin 560 in the limited area 502. As illustrated in FIG. 11 and discussed above, if N equals two and M equals three, then the periodic pattern repeats with every second gate 550 and with every third fin 560 in the limited area 502 and so on.

Finally, the fins 560 can comprise a predetermined second pitch 692 (i.e., a predetermined fin pitch). The value of this fin pitch 692 can be calculated (i.e., tailored) based on the pre-selected angle B 693 of the fins 560 relative to the gates 550, on the ratio of N over M in the pre-selected periodic pattern and on the contacted-gate pitch 691, in order to achieve the periodic pattern without mismatch between the contacted-gate pitch 691 and the fin pitch 692 (i.e., so that angled semiconductor fins corresponding to adjacent stacked gates are aligned and connected). More specifically, the fin pitch 692 can be equal to the ratio of N/M multiplied by the contacted-gate pitch 691 and further multiplied by the cosine of the angle B 693 of the fins 560 relative to the gates 550. It should be noted that N and M are pre-selected such the fin pitch is as great as or greater than the currently achievable minimum lithographic fin pitch. Due to this calculated fin pitch, as opposed to a currently achievable minimum lithographic fin pitch, device density is maximized in the limited area without mismatch between the contacted-gate pitch and fin pitch.

Therefore, disclosed above are embodiments of semiconductor structure and a method of forming the semiconductor structure that simultaneously maximizes device density and avoids contacted-gate pitch and fin pitch mismatch, when multiple parallel angled fins are formed within a limited area on a substrate and then traversed by multiple parallel gates (e.g., in the case of multiple, stacked, chevron-configured, complementary metal oxide semiconductor (CMOS) devices). This is accomplished by using, not a minimum lithographic fin pitch, but rather by using a fin pitch that is calculated as a function of a pre-selected contacted-gate pitch, a pre-selected fin angle and a pre-selected periodic pattern for positioning the fins relative to the gates within the limited area. Thus, the disclosed structure and method allow for the conversion of a semiconductor product design layout with multiple planar FETs in a given area into a semiconductor product design layout with multiple, stacked, chevron-configured, non-planar FETs (i.e., stacked finFETs or trigate FETs having angled semiconductor fins) in the same area. Additionally, as a result of this invention, very dense finFET circuits with high-mobility n and p-type FETs may be fabricated. These dense finFET circuits are capable of operating at a higher speed using a lower power than prior art circuits. Furthermore, cost savings during the manufacturing process of such finFET circuits may also be enjoyed.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the invention can be practiced with modification within the spirit and scope of the appended claims.

What is claimed is:

1. An integrated circuit structure comprising:
   a substrate;
   a limited area within said substrate, said limited area being essentially rectangular in shape;
   multiple parallel angled semiconductor fins on said substrate diagonally traversing in said limited area, each of said fins comprising a discrete linear structure; and
   multiple parallel gates on said substrate extending laterally across a width of said limited area and traversing said fins,
   wherein said gates have a pre-selected first pitch,
   wherein at least one of said fins is traversed by more than one of said gates,
   wherein said fins are positioned diagonally relative to said gates at a pre-selected angle and according to a pre-selected periodic pattern with none of said fins being only partially traversed by a gate and none of said gates traversing an end of a fin, and
   wherein said fins further have a second pitch that is predetermined, based on said angle and said first pitch, in order to achieve said periodic pattern.

2. The structure according to claim 1, wherein said second pitch is approximately equal to said first pitch multiplied by the cosine of said angle.

3. The structure according to claim 1, wherein said angle is other than 90 degrees.

4. The structure according to claim 1,
   wherein said periodic pattern repeats within said limited area at every gate and with every fin, and
   wherein, as a function of said periodic pattern, a first side of a right triangle extends vertically from a first intersecting point between a first gate and a first fin to a second intersecting point between a second gate adjacent to said first gate and a second fin adjacent to said first fin, a second side of said right triangle extends along said second gate from said second intersecting point to a third intersecting point between said first fin and said second gate, a hypotenuse of said right triangle extends along said first fin from said third intersecting point to said first intersecting point and a length of a bisecting line d through said right triangle is equal to said second pitch.

5. An integrated circuit structure comprising:
   a substrate;
   a limited area within said substrate, said limited area being essentially rectangular in shape;
   multiple parallel angled semiconductor fins on said substrate in said limited area, each of said fins comprising a discrete linear structure; and
   multiple parallel gates on said substrate extending laterally across a width of said limited area and traversing said fins,
   wherein said gates have a pre-selected first pitch,
   wherein at least one of said fins is traversed by more than one of said gates,
   wherein said fins are positioned diagonally relative to said gates at a pre-selected angle and according to a pre-selected periodic pattern with none of said fins being only partially traversed by a gate and none of said gates traversing an end of a fin,
   wherein said pre-selected periodic pattern repeats within said limited area at every Nth gate and at every Mth fin,
   wherein N and M are pre-selected whole numbers greater than zero and at least one of N and M is greater than 1, and
   wherein said fins further have a second pitch that is predetermined, based on said angle, a ratio of N over M, and said first pitch, in order to achieve said periodic pattern.

6. The structure according to claim 5, wherein said second pitch is approximately equal to said ratio of N/M multiplied by said first pitch multiplied by the cosine of said angle.

7. The structure according to claim 5, wherein said angle is other than 90 degrees.

8. The structure according to claim 5, wherein N is equal to 2 and M is equal to 1, and wherein, as a function of said periodic pattern, a first side of a right triangle extends vertically from a first intersecting point between a first gate and a first fin through a second gate adjacent to said first gate and to a second intersecting point between a third gate adjacent to said second gate and a second fin adjacent to said first fin, a second side of said right triangle extends along said third gate from said second intersecting point to a third intersecting point between said first fin and said third gate, a hypotenuse of said right triangle extends along said first fin from said third intersecting point to said first intersecting point and a length of a bisecting line d through said right triangle equals said second pitch.

9. The structure according to claim 5, wherein N is equal to 1 and M is equal to 2 and wherein, as a function of said periodic pattern, a first side of a right triangle extends vertically from a first intersecting point between a first gate and a first fin through a second fin adjacent to said first fin and to a second intersecting point between a second gate adjacent to said first gate and a third fin adjacent to said second fin, a second side of said right triangle extends along said second gate from said second intersecting point through said second fin to a third intersecting point between said first fin and said second gate, a hypotenuse of said right triangle extends along said first fin from said third intersecting point to said first intersecting point and a length of a bisecting line d through said right triangle equals two times said second pitch.

10. The structure according to claim 5, wherein N is equal to 1 and M is equal to 3, and wherein, as a function of said periodic pattern, a first side of a right triangle extends vertically from a first intersecting point between a first gate and a first fin through a second fin adjacent to said first fin, through a third fin adjacent to said second fin, and to a second intersecting point between a second gate adjacent to said first gate and a fourth fin adjacent to said third fin, a second side of said right triangle extends along said second gate from said second intersecting point through said second fin and said third fin to a third intersecting point between said first fin and said second gate, a hypotenuse of said right triangle extends along said first fin from said third intersecting point to said first intersecting point and a length of a bisecting line d through said right triangle equals three times said second pitch.

11. The structure according to claim 5, wherein N is equal to 2 and M is equal to 3, and wherein, as a function of said periodic pattern, a first side of a right triangle extends vertically from a first intersecting point between a first gate and a first fin through a second gate adjacent to said first gate, through a second fin adjacent to said first fin, through a third fin adjacent to said second fin, and to a second intersecting point between a third gate adjacent to said second gate and a fourth fin adjacent to said third fin, a second side of said right triangle extends along said third gate from said second intersecting point through said second fin and said third fin to a third intersecting point between said first fin and said third gate, a hypotenuse of said right triangle extends along said first fin from said third intersecting point to said first intersecting point and a length of a bisecting line d through said right triangle equals three times said second pitch.

12. An integrated circuit structure comprising:
a substrate;
a limited area within said substrate, said limited area being essentially rectangular in shape;
multiple parallel angled semiconductor fins on said substrate in diagonally traversing said limited area, each of said fins comprising a discrete linear structure and at least some of said fins having different lengths;
multiple parallel gates on said substrate extending laterally across a width of said limited area and traversing said fins,
wherein said gates have a pre-selected first pitch,
wherein at least one of said fins is traversed by more than one of said gates,
wherein said fins are positioned diagonally relative to said gates at a pre-selected angle and according to a pre-selected periodic pattern with none of said fins being only partially traversed by a gate and none of said gates traversing an end of a fin,
wherein said pre-selected periodic pattern repeats within said limited area at every Nth gate and at every Mth fin, N and M being pre-selected whole numbers greater than zero, and
wherein said fins further have a second pitch that is predetermined, based on said angle, a ratio of N over M, and said first pitch, in order to achieve said periodic pattern.

13. The structure according to claim 12, wherein said second pitch is approximately equal to said ratio of N/M multiplied by said first pitch multiplied by the cosine of said angle.

14. The structure according to claim 12, wherein said angle is other than 90 degrees.

15. The structure according to claim 12, wherein N is equal to 1 and M is equal to 1, and wherein, as a function of said periodic pattern, a first side of a right triangle extends vertically from a first intersecting point between a first gate and a first fin to a second intersecting point between a second gate adjacent to said first gate and a second fin adjacent to said first fin, a second side of said right triangle extends along said second gate from said second intersecting point to a third intersecting point between said first fin and said second gate, a hypotenuse of said right triangle extends along said first fin from said third intersecting point to said first intersecting point and a length of a bisecting line d through said right triangle is equal to said second pitch.

16. The structure according to claim 12, wherein N is equal to 2 and M is equal to 1, and wherein, as a function of said periodic pattern, a first side of a right triangle extends vertically from a first intersecting point between a first gate and a first fin through a second gate adjacent to said first gate and to a second intersecting point between a third gate adjacent to said second gate and a second fin adjacent to said first fin, a second side of said right triangle extends along said third gate from said second intersecting point to a third intersecting point between said first fin and said third gate, a hypotenuse of said right triangle extends along said first fin from said third intersecting point to said first intersecting point and a length of a bisecting line d through said right triangle equals said second pitch.

17. The structure according to claim 12, wherein N is equal to 1 and M is equal to 2, and wherein, as a function of said periodic pattern, a first side of a right triangle extends vertically from a first intersecting point between a first gate and a first fin through a second fin adjacent to said first fin and to a second intersecting point between a second gate adjacent to said first gate and a third fin adjacent to said second fin, a second side of said right triangle extends along said second gate from said second intersecting point through said second fin to a third intersecting point between said first fin and said second gate, a hypotenuse of said right triangle extends along said first fin from said third intersecting point to said first intersecting point and a length of a bisecting line d through said right triangle equals two times said second pitch.

18. The structure according to claim 12, wherein N is equal to 1 and M is equal to 3, and wherein, as a function of said periodic pattern, a first side of a right triangle extends vertically from a first intersecting point between a first gate and a first fin through a second fin adjacent to said first fin, through a third fin adjacent to said second fin, and to a second intersecting point between a second gate adjacent to said first gate and a fourth fin adjacent to said third fin, a second side of said right triangle extends along said second gate from said second intersecting point through said second fin and said third fin to a third intersecting point between said first fin and said second gate, a hypotenuse of said right triangle extends along said first fin from said third intersecting point to said first intersecting point and a length of a bisecting line d through said right triangle equals three times said second pitch.

19. The structure according to claim 12, wherein N is equal to 2 and M is equal to 3, and wherein, as a function of said periodic pattern, a first side of a right triangle extends vertically from a first intersecting point between a first gate and a first fin through a second gate adjacent to said first gate, through a second fin adjacent to said first fin, through a third fin adjacent to said second fin, and to a second intersecting point between a third gate adjacent to said second gate and a fourth fin adjacent to said third fin, a second side of said right triangle extends along said third gate from said second intersecting point through said second fin and said third fin to a third intersecting point between said first fin and said third gate, a hypotenuse of said right triangle extends along said first fin from said third intersecting point to said first intersecting point and a length of a bisecting line d through said right triangle equals three times said second pitch.

* * * * *